United States Patent
Lienau

(12) United States Patent (10) Patent No.: US 6,710,624 B2
(45) Date of Patent: Mar. 23, 2004

(54) PROGRAMMABLE ARRAY LOGIC CIRCUIT MACROCELL USING FERROMAGNETIC MEMORY CELLS

(76) Inventor: Richard M. Lienau, HC 70, Box 19Z, Pecos, NM (US) 87552

( * ) Notice: Subject to any disclaimer, the term of this patent is extended or adjusted under 35 U.S.C. 154(b) by 8 days.

(21) Appl. No.: 10/239,226

(22) PCT Filed: Jan. 20, 2001

(86) PCT No.: PCT/US01/01790

§ 371 (c)(1),
(2), (4) Date: Sep. 18, 2002

(87) PCT Pub. No.: WO01/54133

PCT Pub. Date: Jul. 26, 2001

(65) Prior Publication Data

US 2003/0222675 A1 Dec. 4, 2003

Related U.S. Application Data

(60) Provisional application No. 60/177,478, filed on Jan. 21, 2000.

(51) Int. Cl.[7] .................................................. H03K 7/38
(52) U.S. Cl. ............................. 326/40; 326/38; 326/46; 326/37
(58) Field of Search ............................... 326/37–41, 46, 326/47

(56) References Cited

U.S. PATENT DOCUMENTS

| | | | |
|---|---|---|---|
| 4,791,604 A | 12/1988 | Lienau et al. | |
| 5,295,097 A | 3/1994 | Lienau | |
| 6,140,139 A | 10/2000 | Lienau et al. | |
| 6,229,729 B1 | 5/2001 | Lienau | |
| 6,266,267 B1 | 7/2001 | Lienau | |
| 6,288,929 B1 | 9/2001 | Lienau | |
| 6,317,354 B1 | 11/2001 | Lienau | |
| 6,330,183 B1 | 12/2001 | Lienau | |
| 6,341,080 B1 | 1/2002 | Lienau et al. | |
| 6,542,000 B1 * | 4/2003 | Black et al. | 326/39 |
| 6,573,713 B2 * | 6/2003 | Torok et al. | 324/252 |

* cited by examiner

*Primary Examiner*—Anh Tran
(74) *Attorney, Agent, or Firm*—Jones, Waldo, Holbrook & McDonough; Brent T. Winder

(57) ABSTRACT

A programmable array logic circuit macrocell using ferromagnetic memory cells. More particularly, the present invention uses a non-volatile ferromagnetic memory cell to temporarily store binary data. It is an advantage of the invention to have the ferromagnetic memory cells or bits to store data even when there is no power provided to the circuitry, thus saving power during operation of the programmable logic circuitry, and ensuring that there is no loss of the data should there be a temporary power shutdown. Additionally, the ferromagnetic cells provide for indefinite number of switching actions on the data without degradation to the capacity to store data therein, thus eliminating "write fatigue". The invention provides an integrated circuit, comprising a programmable OR array (24), a programmable AND array (28), coupled to the programmable OR array, and a macrocell output circuit (22). The macrocell uniquely has a ferromagnetic bit (11) and sensor (12) coupled to store remnant output signal, and an output buffer (34), coupled to output the remnant output signal upon receiving an output enable signal. The macrocell may further include a DQ register that contains the ferromagnetic bit. The DQ register may also include a drive coil, which at least partially surrounds the ferromagnetic bit. Drive coils may have a bi-directional current that sets the polarity of the ferromagnetic bit. The bi-directional current may be switched by two sets of transistor pairs (Q10 and Q11). The two sets of transistor pairs may, in turn, be gated by first and second transistor respectively. The first and second transistors may be responsive to a DATA signal that is received when a CLOCK signal is received.

21 Claims, 4 Drawing Sheets

US 6,710,624 B2

PROGRAMMABLE ARRAY LOGIC CIRCUIT MACROCELL USING FERROMAGNETIC MEMORY CELLS

This application is a 371 of application Ser. No. PCT/US01/01790 filed Jan. 20, 2001, which claims benefit of 60/177,478 filed Jan. 21, 2000.

BACKGROUND OF THE INVENTION

1. The Field of the Invention

The present invention relates generally to a programmable array logic circuit macrocell using ferromagnetic memory cells. More particularly, the present invention uses a non-volatile ferromagnetic memory cell to temporarily store binary data.

2. The Background Art

Programmable logic devices have any number product sets, usually in groups of four (4), eight (8), sixteen (16) or more bits, although often in groups of ten (10). The arrays are programmed for application-specific tasks to be performed within digital electronic circuits. The fusible link types cannot be re-programmed, but those employing EEPROM and Flash can. For those PALs which use fusible links, the data in the "D" registers is lost at power off. For those that use EEPROM and Flash as replacements for the "D" registers, data is not lost at power off time.

Up to the present, traditional PALs have used "D" type flip-flops for product registers. Lately, however, some fabricators have begun using EEPROM and Flash technology to replace these. These last two technologies have drawbacks, however. EEPROMs are cumbersome to re-program, both are slow to re-program, exhibit "write fatigue," thereby limiting their useful life, and must be mass-written to re-program.

SUMMARY OF THE INVENTION

It has been recognized that it would be advantageous to develop a programmable array logic circuit macrocell using ferromagnetic memory cells. More particularly, the present invention uses a non-volatile ferromagnetic memory cell to temporarily store binary data.

It is an advantage of the invention to have the ferromagnetic memory cells or bits to store data even when there is no power provided to the circuitry, thus saving power during operation of the programmable logic circuitry, and ensuring that there is no loss of the data should there be a temporary power shut down.

Additionally, the ferromagnetic cells provide for indefinite number of switching actions on the data without degradation to the capacity to store data therein, thus eliminating "write fatigue".

The invention provides an integrated circuit, comprising a programmable OR array, a programmable AND array, coupled to the programmable OR array, and a macrocell output circuit. The macrocell uniquely has a ferromagnetic bit and sensor coupled to store a remnant output signal, and an output buffer, coupled to output the remnant output signal upon receiving a output enable signal. The macrocell may further include a DQ register that contains the ferromagnetic bit. The DQ register may also include a drive coil, which at least partially surrounds the ferromagnetic bit. Drive coils may have a bi-directional current that sets the polarity of the ferromagnetic bit. The bi-directional current may be switched by two sets of transistor pairs. The two sets of transistor pairs may, in turn, be gated by first and second transistor respectively. The first and second transistors may be responsive to a DATA signal that is received when a CLOCK signal is received.

Additional features and advantages of the invention will be set forth in the detailed description which follows, taken in conjunction with the accompanying drawing, which together illustrate by way of example, the features of the invention.

DETAILED DESCRIPTION

Figure 1:
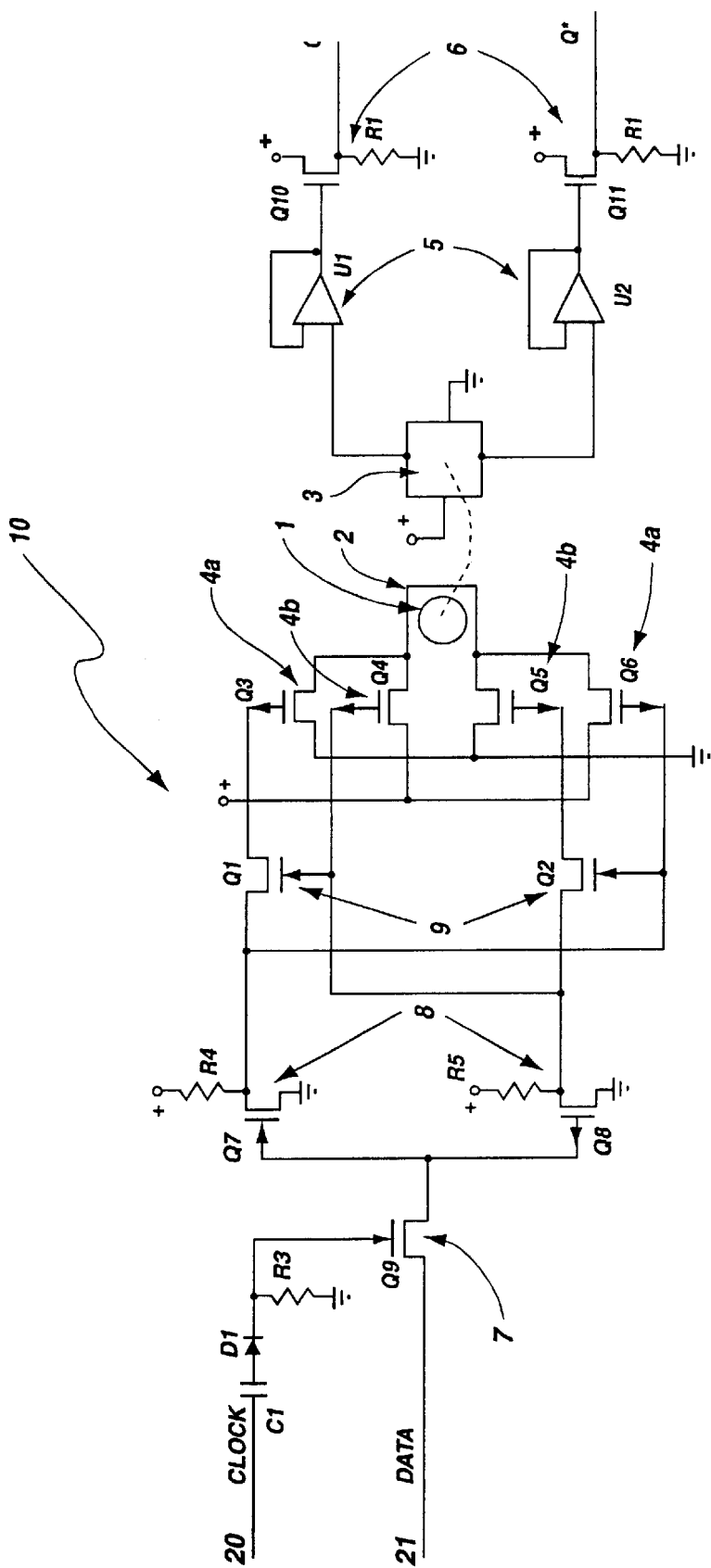
FIG. 1 is a schematic of a preferred embodiment of the present invention.

For the purposes of promoting an understanding of the principles of the invention, reference will now be made to the exemplary embodiments illustrated in the drawings, and specific language will be used to describe the same. It will nevertheless be understood that no limitation of the scope of the invention is thereby intended. Any alterations and further modifications of the inventive features illustrated herein, and any additional applications of the principles of the invention as illustrated herein, which would occur to one skilled in the relevant art and having possession of this disclosure, are to be considered within the scope of the invention.

For the purpose of providing background material which may in some respects illustrate the state of the are, the following books are herein incorporated by reference for non-essential material: "Programmable Logic Handbook," fourth edition, by Monolithic Memories Inc., 2175 Mission College Blvd., Santa Clara, Calif.; and "Practical Design Using Programmable Logic," by D. Pellerin and M. Holley, Prentice Hall, library of Congress no. TK7872.L64 1991.

The following United States patents are herein incorporated by reference for their supporting teachings:

U.S. Pat. No. 5,300,830, is a programmable logic device macrocell with an exclusive feedback and exclusive external input lines for registered and combinatorial modes using a dedicated product term for control.

U.S. Pat. No. 5,287,017, is a programmable logic device macrocell with two OR array inputs.

U.S. Pat. No. 5,324,998, is a zero power re-programmable flash cell for a programmable logic device.

U.S. Pat. No. 5,295,097, is a nonvolatile random access memory.

U.S. Pat. No. 5,867,049, is a zero setup time flip flop.

U.S. Pat. No. 5,298,803, is a programmable logic device having low power microcells with selectable registered and combinatorial output signals.

The invention is used in the normal arena in which PALs are employed, but where it may be advantageous to retain the last data stored after removal of power to the circuit as well as the simplicity of random re-programming. This PAL circuit could be in all manner of digital circuitry, including computers, robotics, telephones, automotive circuits, security devices, and so on. The advantages over prior art lie principally in that PAL devices using ferromagnetic digital memory cells for product registers would enjoy nonvolatility, high-speed in situ random re-programmability and indefinite long life span.

A PAL having product registers (flip flops) that use non-volatile ferromagnetic memory/storage cells for product storage registers is described wherein the non-volatile ferromagnetic memory cells, comprised of single stick-like ferromagnets whose aspect ratio is greater than 1:1 (height to width, e.g. 2:1 etc.), are fabricated normal to the plane of the substrate with a sensor centered intimate to, and at one end of the ferromagnets are used for these functions. The magnetic polarity of each ferromagnetic memory cell bit is coerced into reversal using write, or state change circuitry, comprised of a coil which surrounds, up to and including 270°, and is intimate to, the ferromagnetic stick. The write current in each coil is bi-directional, depending on the desired magnetic movement, or polarity, of the bit. The output of the sensor reflects the binary condition of the bit, and is used as binary data output for product registers.

FIG. 1 is a schematic of a dual output storage register 10, or flip-flop, which is comprised of a ferromagnetic memory cell consisting of micron or sub-micron sized ferromagnetic bit whose aspect ratio is greater than 1:1 (i.e., 2:1, etc.), deposited normal to the plane of the substrate with its attendant support circuitry. Uniquely, there is a ferromagnetic stick (bit) 1, which is at least partially, but not necessarily completely, surrounded by a write drive coil 2. The bi-directional current in the write drive coil sets the polarity of the bit and is switched by two sets of transistor pairs, or switches. The first transistor pair being Q3 and Q6, having reference number 4a, and the second pair being Q4 and Q5, having reference number 4b. These switches are in turn gated by Q1 and Q2, having reference number 7. With a signal on the DATA 21 line and a positive-going pulse on the CLOCK 20 line, either Q7 or Q8 will be activated to allow the memory cell 1 to be set to one binary position or another. Other features of the drawing are: capacitor C1, diode D1, resistors R3 tied to ground, and R4 and R5 which are both tied to power+.

Figure 3:
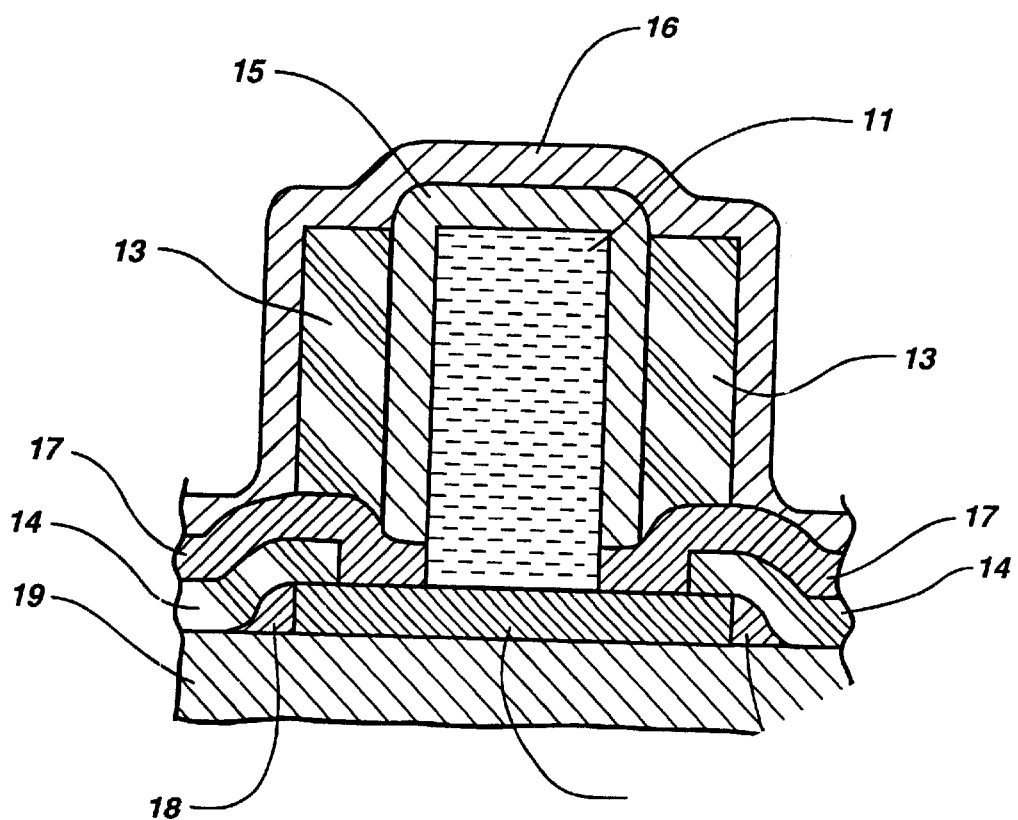
FIG. 3 is a cross sectional view of a single ferromagnetic memory bit.

On a second portion of the flip-flop 10, or storage register circuit, there is a ferromagnetic bit field sensor 3, which is capable of sensing remnant polarity stored in the bit 1. It is noted that the dashed line is meant to illustrate the fact that the sensor 3 is to be physically located proximate the top or bottom of the ferromagnetic bit 1, but is illustrated at a spaced relationship for schematic purposes only and not meant to illustrate physical layout as is shown in FIG. 3. Additionally, amplifiers U1 and U2, having reference number 5, respond based on the Hall voltage that appears across the sensor 3. The outputs are fed to the transistors Q10 and Q11, reference number 6, whose outputs, in turn, are "Q" and "Q*". In summary, the DATA is set into the cell with the rising CLOCK line and stored in the ferromagnetic memory bit 1 despite any power shutdown after being stored. Thereafter, the output in this case employs two operational amplifiers whose differential outputs are fed; one to the Q output and the other, Q* to the product feedback circuit.

Since the ferromagnetic bit does not change state when power to the circuit is off, when power has thereafter been restored subsequent to a power off, the storage registers will have retained their critical data. Additionally, even while there is power to the programmable logic device, it is noted that additional power is not required to maintain the stored state in the flip-flop 10, thus, saving overall power consumption.

Figure 2:
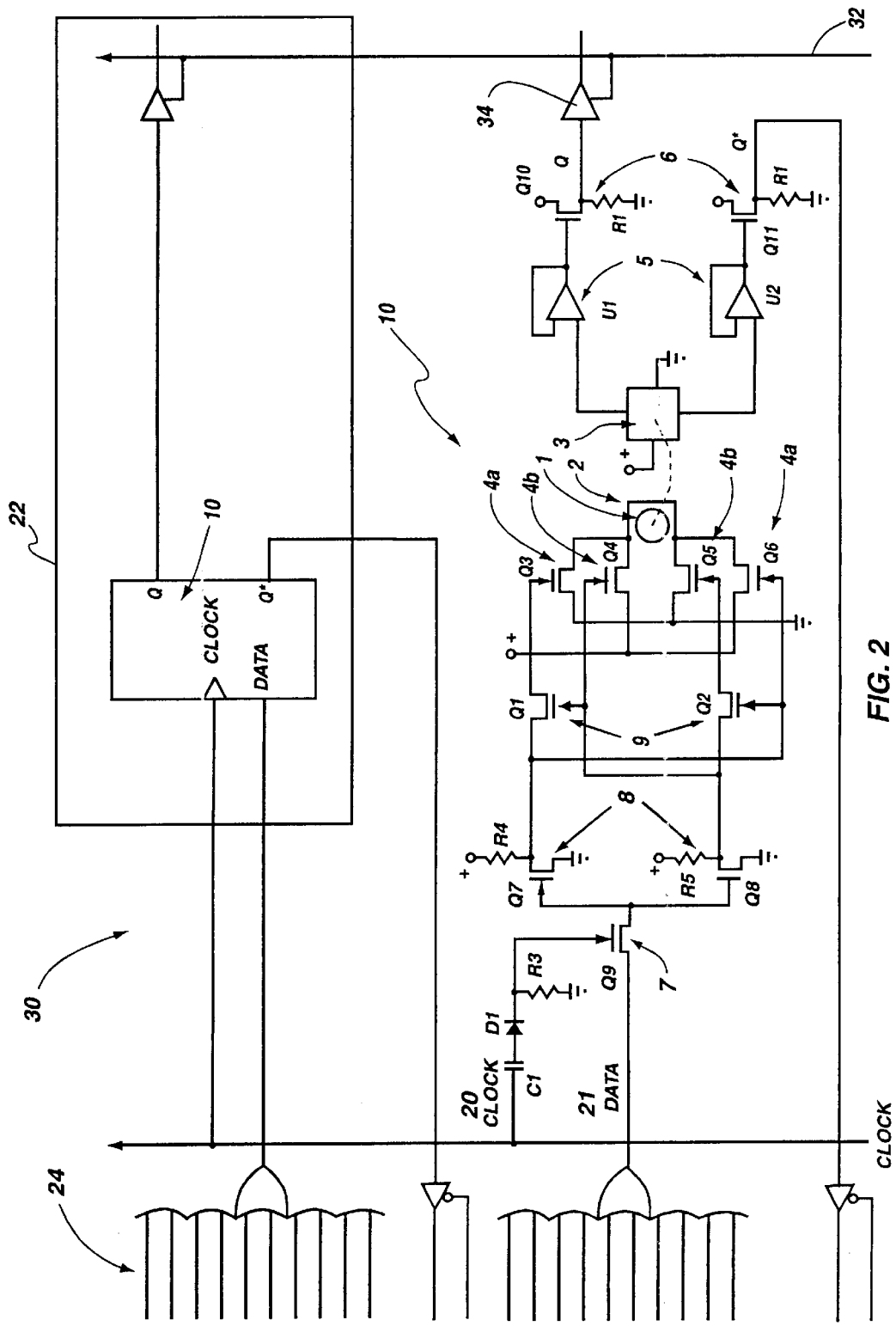
FIG. 2 is a schematic of a preferred embodiment of the present invention.

FIG. 2 is a representation of the "DQ" type register or flip-flop 10 of FIG. 1 and is part of the output macrocell circuitry 22 that receives data from an OR array 24 from a typical PAL 30, (programmable array logic). It is noted that one skilled in the art will easily realize that the bit 1 will store a remnant polarity in the ferromagnetic material that the sensor 3 will be able to sense. Thus, creating a remnant output signal that will cause the amplifiers 5 to simultaneously and constantly open or close the gates of output transistors 6 accordingly; and where the polarity of the bit will exist even after the power to the circuitry has been turned off. To output the data signal Q, output enable signal line 32 will pulse to enable the output amplifier 34, or output buffer.

FIG. 3 depicts, for example, a potential cross-section of a micron or sub-micron scale ferromagnetic memory cell with the sensor shown on the bottom. There is a ferromagnetic storage element 11, or "bit," a sensor 12, a sample drive line 14, which is made of Al, Cu or any other suitable conductor material. Additionally there is a cutaway of the set (write) drive coil 13 that wraps around bit 11. In this depiction, matrix interconnects are not shown for the sake of clarity. The entire memory cell rests on substrate 19, which can be silicon, glass, GaAs, or other suitable material. Insulation layer 15 resides between the ferromagnetic bit 11 and the set coil 13. Material layer 15 can be of a material such as $SiO_2$ or $Si_3N_4$, etc. There is an overall insulation sections 16, 17 and 18, again made of $SiO_2$, $Si_3N_4$, or other suitable material.

Several methods may be employed to make this cell, including, but not limited to, electroplating, sputtering, E-beam deposition, chemical vapor deposition and molecular beam epitaxy.

Figure 4:
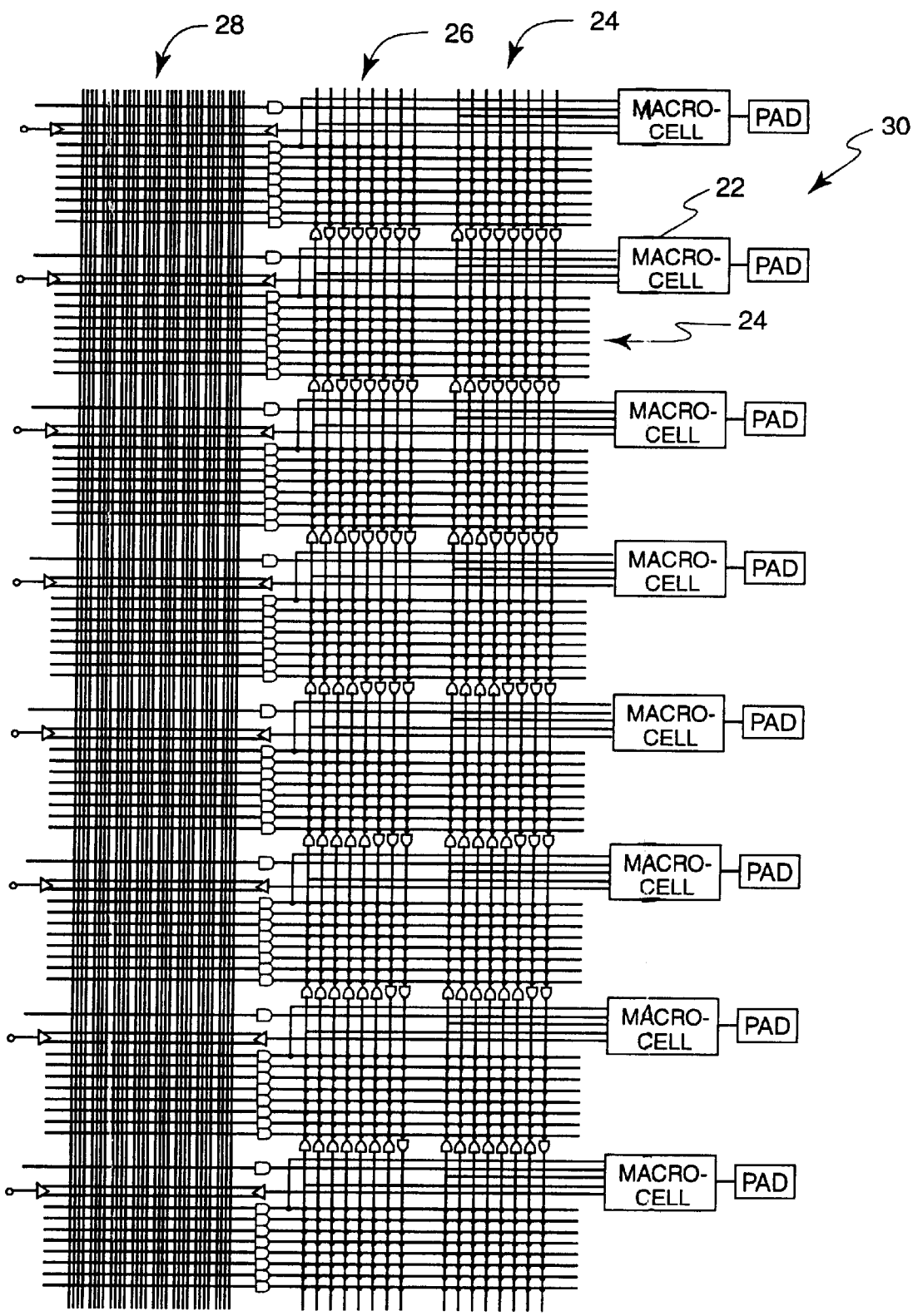
FIG. 4 is a schematic of a field programmable logic device capable of utilizing the present invention.

Referring to FIG. 4, there is an embodiment of the invention being utilized in a field programmable logic device 30. One skilled in the art will recognize that there is a programmable AND 28 array with inputs and outputs. Similarly, there are two programmable OR arrays 24 and 26 that rout signals through various levels or numbers of logical OR gates before the sum of products are sent to designated macrocells. Additionally, there is illustrated macrocell 22. It is noted that the macrocells have one of the flip-flops 10 located therein.

It is understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been shown in the drawings and fully described above with particularity and detail in connection with what is presently deemed to be the most practical and preferred embodiment(s) of the invention, it will be apparent to those of ordinary skill in the art that numerous modifications, including, but not limited to, variations in size, materials, shape, form, function and manner of operation, assembly and use may be made, without departing from the principles and concepts of the invention as set forth in the claims.

What is claimed is:

1. An integrated circuit, comprising:
   a) a programmable OR array;
   b) a programmable AND array, coupled to the programmable OR array; and
   c) a macrocell output circuit, having:
      1) a ferromagnetic bit and sensor coupled to store a remnant output signal; and 2) an output buffer, coupled to output the remnant output signal upon receiving an output enable signal.

2. The integrated circuit of claim 1, wherein the macrocell further includes a DQ register that contains the ferromagnetic bit.

3. The integrated circuit of claim 2, wherein the DQ register includes a drive coil, which at least partially surrounds the ferromagnetic bit.

4. The integrated circuit of claim 3, wherein drive coil has a bi-directional current that sets the polarity of the ferromagnetic bit.

5. The integrated circuit of claim 4, wherein the bi-directional current is switched by two sets of transistor pairs.

6. The integrated circuit of claim 4, wherein the two sets of transistor pairs are in turn gated by a first and a second transistor respectively.

7. The integrated circuit of claim 4, wherein the first and second transistors are responsive to a DATA signal that is received when a CLOCK signal is received.

8. An integrated circuit, comprising:
a) a programmable logic array; and
b) a macrocell output circuit, coupled to the programmable logic circuit, having:
1) a ferromagnetic bit and sensor coupled to store a remnant output signal; and
2) an output buffer, coupled to output the remnant output signal upon receiving an output enable signal.

9. The integrated circuit of claim 8, wherein the programmable logic array includes a logical AND array and a logical OR array.

10. The integrated circuit of claim 8, wherein the ferromagnetic bit has a height that is greater than its width.

11. The integrated circuit of claim 10, wherein the macrocell output circuit has a supporting substrate, to support the ferromagnetic bit to have the height oriented perpendicular thereto.

12. The integrated circuit of claim 11, wherein the sensor is located below the ferromagnetic bit and above the substrate.

13. The integrated circuit of claim 12, wherein the macrocell output circuit has a set and reset input to program the remnant output signal that is to be stored in the ferromagnetic bit.

14. A programmable logic device, comprising:
a) a programmable logic array; and
b) a macrocell output circuit, coupled to receive resultant signals processed through the programmable logic array, having:
i) a ferromagnetic bit coupled to store a remnant output signal; and
ii) an output buffer, coupled to output the remnant output signal upon receiving an output enable signal.

15. The programmable logic device of claim 14, wherein the programmable logic array includes a programmable OR array.

16. The programmable logic device of claim 14, wherein the programmable logic array includes a programmable AND array.

17. The programmable logic device of claim 16, wherein the macrocell output circuit further includes a sensor, positioned proximate to the ferromagnetic bit, to sense the polarity of the ferromagnetic bit and to create the remnant output signal therefrom.

18. The programmable logic device of claim 17, wherein the ferromagnetic bit has a height that is greater than its width.

19. The programmable logic device of claim 18, wherein the macrocell output circuit has a supporting substrate, to support the ferromagnetic bit to have the height oriented perpendicular thereto.

20. The programmable logic device of claim 19, wherein the sensor is located below the ferromagnetic bit and above the substrate.

21. The programmable logic device of claim 20, wherein the macrocell output circuit has a set and reset input to program the remnant output signal that is to be stored in the ferromagnetic bit.

* * * * *